(12) United States Patent
Ham et al.

(10) Patent No.: US 12,453,058 B2
(45) Date of Patent: Oct. 21, 2025

(54) HEAT DISSIPATION STRUCTURE AND ELECTRONIC DEVICE INCLUDING SAME

(71) Applicant: SAMSUNG ELECTRONICS CO., LTD., Suwon-si (KR)

(72) Inventors: Taewook Ham, Suwon-si (KR); Moonhyung Kwon, Suwon-si (KR); Min Park, Suwon-si (KR); Younggirl Yun, Suwon-si (KR); Taekkyun Choi, Suwon-si (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 281 days.

(21) Appl. No.: 18/303,284

(22) Filed: Apr. 19, 2023

(65) Prior Publication Data

US 2023/0262940 A1    Aug. 17, 2023

Related U.S. Application Data

(63) Continuation of application No. PCT/KR2021/017192, filed on Nov. 22, 2021.

(30) Foreign Application Priority Data

Nov. 23, 2020    (KR) .................. 10-2020-0157830

(51) Int. Cl.
*H05K 7/20* (2006.01)
*G06F 1/20* (2006.01)

(52) U.S. Cl.
CPC ......... *H05K 7/20481* (2013.01); *G06F 1/203* (2013.01)

(58) Field of Classification Search
CPC . H01L 23/367; H01L 23/3675; H01L 23/552; H01L 23/5389; H01L 2225/06589;
(Continued)

(56) References Cited

U.S. PATENT DOCUMENTS 9,257,364 B2 * 2/2016 Ahuja .................. H01L 21/4882
9,420,734 B2 * 8/2016 Liu ....................... H05K 9/0026
(Continued)

FOREIGN PATENT DOCUMENTS

JP          2019186310 A    10/2019
KR       20140019066 A     2/2014
(Continued)

OTHER PUBLICATIONS

International Search Report for PCT/KR2021/017192 mailed Mar. 4, 2022, 2 pages.
(Continued)

*Primary Examiner* — Michael A Matey
(74) *Attorney, Agent, or Firm* — Nixon & Vanderhye P.C.

(57) ABSTRACT

An electronic device according to various embodiments of the present disclosure may comprise: a circuit board; at least one electronic component disposed on one surface of the circuit board; a shield can mounted to the one surface of the circuit board and accommodating the electronic component therein and includes at least one opening formed in the area corresponding to the electric component; a heat-dissipating structure disposed in at least a part of the shield can to close at least a part of the at least one opening; and a heat transfer member disposed between and in contact with the electronic component and the heat-dissipating structure and at least a part of which is disposed in the at least one opening.

17 Claims, 9 Drawing Sheets

(58) Field of Classification Search
CPC ........... H01L 21/563; H01L 2924/3025; H01L 2023/4087; H01L 21/56; H05K 9/0024; H05K 9/0032; H05K 7/20445; H05K 7/2039; H05K 1/0203; H05K 2201/10371; H05K 9/0031; H05K 9/0081; H05K 2201/066; H05K 1/0204; H05K 7/20; H05K 9/0026; H05K 7/20481; G06F 1/20; G06F 1/203; G02F 1/133512

See application file for complete search history.

(56) References Cited

U.S. PATENT DOCUMENTS

| | | | |
|---|---|---|---|
| 11,013,150 B2 * | 5/2021 | Kim | H05K 7/205 |
| 2013/0337273 A1 | 12/2013 | Boday et al. | |
| 2014/0022733 A1 | 1/2014 | Lim et al. | |
| 2015/0264842 A1 * | 9/2015 | Song | H01L 23/42 29/840 |
| 2016/0037692 A1 | 2/2016 | Zhang et al. | |
| 2018/0288908 A1 * | 10/2018 | Lee | H05K 9/0031 |
| 2019/0121407 A1 * | 4/2019 | Lee | G06F 1/183 |
| 2020/0005919 A1 | 1/2020 | Hill, Sr. et al. | |
| 2020/0053919 A1 * | 2/2020 | Lee | H05K 9/009 |
| 2020/0161229 A1 * | 5/2020 | Gandhi | H01L 23/49811 |
| 2020/0329592 A1 | 10/2020 | Seo et al. | |
| 2020/0352057 A1 * | 11/2020 | Jung | H05K 1/181 |
| 2020/0389999 A1 * | 12/2020 | Lee | H05K 7/20336 |
| 2021/0020542 A1 * | 1/2021 | Kumura | H05K 9/0032 |
| 2021/0059076 A1 * | 2/2021 | Kwon | H05K 7/20445 |
| 2021/0161039 A1 * | 5/2021 | Jung | H05K 1/0203 |
| 2021/0274637 A1 | 9/2021 | Kim et al. | |

FOREIGN PATENT DOCUMENTS

| | | |
|---|---|---|
| KR | 20150108262 A | 9/2015 |
| KR | 20160009914 A | 1/2016 |
| KR | 20170136063 A | 12/2017 |
| KR | 20180013724 A | 2/2018 |
| KR | 20180109615 A | 10/2018 |
| KR | 20190053589 A | 5/2019 |
| KR | 20190101640 A | 9/2019 |
| KR | 10-2020-0011183 A1 | 2/2020 |
| KR | 20200017115 A | 2/2020 |

OTHER PUBLICATIONS

Written Opinion of the ISA for PCT/KR2021/017192 mailed Mar. 4, 2022, 4 pages.
Korean Examination Report dated Feb. 6, 2025 for KR Application No.

* cited by examiner

HEAT DISSIPATION STRUCTURE AND ELECTRONIC DEVICE INCLUDING SAME

CROSS-REFERENCE TO RELATED APPLICATIONS

This application is a continuation of International Application No. PCT/KR2021/017192 designating the United States, filed on Nov. 22, 2021, in the Korean Intellectual Property Receiving Office and claiming priority to Korean Patent Application No. 10-2020-0157830, filed on Nov. 23, 2020, in the Korean Intellectual Property Office, the disclosures of which are incorporated by reference herein in their entireties.

BACKGROUND

Field

The disclosure relates to a heat dissipation structure including a heat diffusion structure and an electronic device including the heat dissipation structure.

Description of Related Art

Thanks to remarkable development of information and communication technology, semiconductor technology, etc., the supply and use of various electronic devices are rapidly increasing. Particularly, recent electronic devices are being developed to be capable of communication while being carried.

An electronic device may indicate a device which performs a specific function according to an installed program, such as a home appliance, an electronic notebook, a portable multimedia player, a mobile communication terminal, a tablet PC, a video/audio device, a desktop/laptop computer, and a vehicle navigation device. For example, such electronic devices may output stored information as sound or image. As the degree of integration of electronic devices increases and ultra-high-speed and large-capacity wireless communication becomes common, recently, a single electronic device such as a mobile communication terminal may be equipped with various functions. For example, not only communication functions, but also entertainment functions such as games, multimedia functions such as music/video playback, communication and security functions such as mobile banking, and functions such as schedule management and electronic wallets are integrated into one electronic device. Such an electronic device is miniaturized to allow a user to conveniently carry the same.

Recently, due to the demand for miniaturization and thinning of a portable electronic device such as a smartphone, and high integration and high performance, such as the application of the latest technologies such as 5G, a lot of heat is produced in the portable electronic device and the heat density may be high. Accordingly, various heat diffusion structures are required to efficiently dissipate heat produced from a heat source in the electronic device.

In general, in an electronic device, a printed circuit board (PCB) and various electronic elements are arranged inside a bracket for mounting elements. Some circuit electronic elements mounted on the printed circuit board (PCB) produce electromagnetic waves and/or heat, and the produced electromagnetic waves and/or heat may cause malfunction and performance degradation of the electronic device.

In addition, various heat dissipation members may be used to dissipate heat produced in the electronic device, but directly attaching a heat dissipation member to some heat sources (e.g., AP) may cause difficulties due to limitations in EMI shielding, insulation, thickness, or strength. In general, in a structure related to a shield can inside an electronic device, a heat transfer member (e.g., CF TIM) and a nano TIM may be stacked and arranged between a heat source and a heat dissipation material (e.g., graphite). However, a nano TIM has a higher thermal resistance compared to a heat transfer member (e.g., CF TIM), and the thermal diffusion performance thereof may be deteriorated.

SUMMARY

Embodiments of the disclosure, provides a heat diffusion structure that may improve heat diffusion performance by excluding nano TIM, which is generally used in heat dissipation structures, and placing a heat diffusion structure containing a heat dissipation material (e.g., graphite) in direct contact with a heat transfer member (e.g., CF TIM).

Embodiments of the disclosure, provide a heat diffusion structure wherein as a heat diffusion structure for providing elasticity is disposed in an area in contact with a shield can, the size (e.g., thickness) of the heat dissipation structure may be reduced, and improved heat dissipation and strength may be provided.

An electronic device according to various example embodiments of the disclosure may include: a circuit board, at least one electronic element disposed on one surface of the circuit board, a shield can mounted on one surface of the circuit board and configured to accommodate the electronic element, the shield can including at least one opening disposed through an area corresponding to the electronic element, a heat diffusion structure comprising a heat diffusing material disposed on at least a part of the shield can to close at least a part of the at least one opening, and a heat transfer member comprising a thermally conductive material disposed between and in contact with the electronic element and the heat diffusion structure and having at least a part located in the at least one opening.

An electronic device according to various example embodiments of the disclosure may include: a housing, a circuit board disposed in the housing, at least one electronic element disposed on one surface of the circuit board, a shield can configured to surround at least a part of the electronic element and having at least one opening formed at a portion facing the electronic element, a heat dissipation member comprising a heat dissipating material disposed on at least a part of the shield can to close at least a part of the at least one opening, a shield configured to surround at least one surface of the heat dissipation member and comprising a thin film, and a heat transfer member comprising a thermally conductive material disposed between and in contact with the electronic element and the heat dissipation member and having at least a part located in the at least one opening.

A heat dissipation structure according to various example embodiments of the disclosure may exclude an auxiliary material having high thermal resistance on a heat path produced by an electronic element and reduce the thickness between a cover and the electronic element of an electronic device, thereby providing an efficient heat transfer path.

A heat dissipation structure according to various example embodiments of the disclosure may provide a heat transfer member disposed in contact with an electronic element disposed on a circuit board and a heat diffusion structure in which at least a part thereof is compressible, thereby providing efficient shielding performance and heat dissipation performance.

A heat dissipation structure according to various example embodiments of the disclosure may provide an integral heat diffusion structure, and an elastic member of the heat diffusion structure may provide upper and lower fluidity to prevent and/or reduce external impact applied to an electronic element.

Effects obtainable in the disclosure are not limited to the effects mentioned above, and other effects not mentioned may be clearly understood from the description below by a person skilled in the art to which the disclosure belongs.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
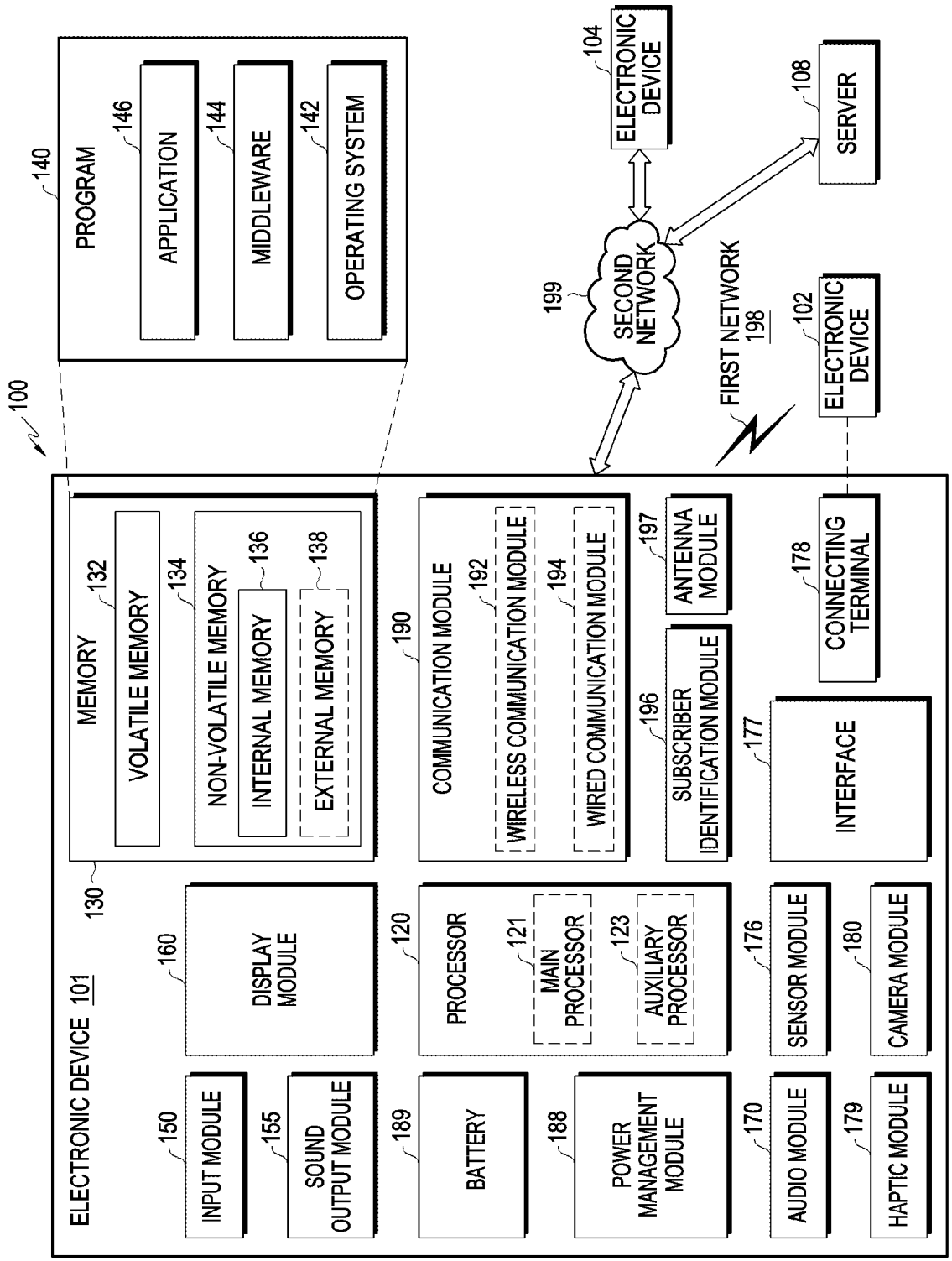
FIG. 1 is a block diagram illustrating an example electronic device in a network environment according to various embodiments.

FIG. 1 is a block diagram illustrating an example electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
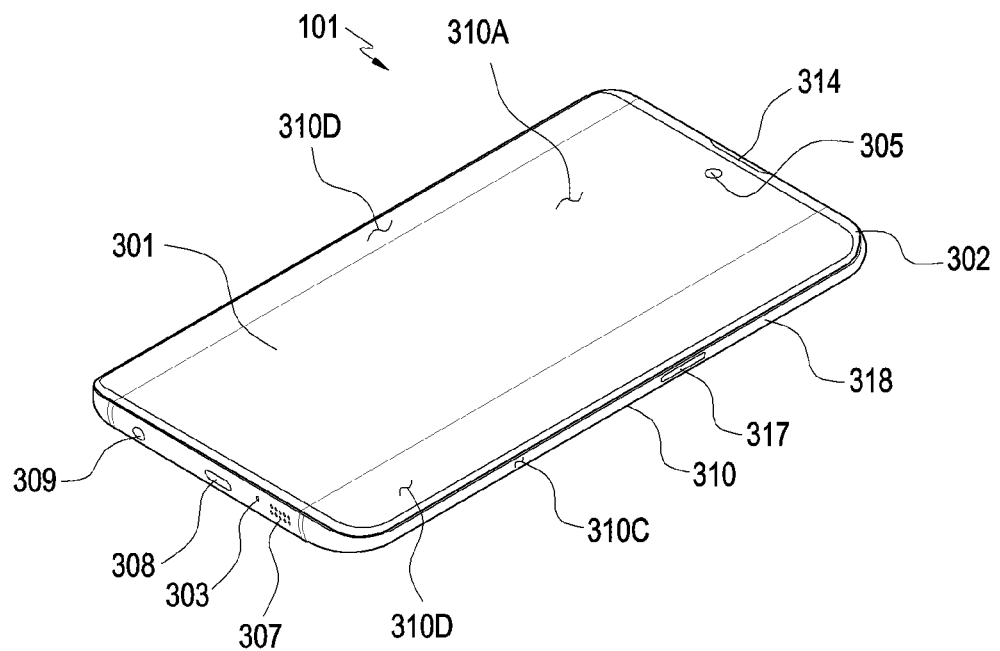
FIG. 2 is a front perspective view of an electronic device according to various embodiments.
Figure 3:
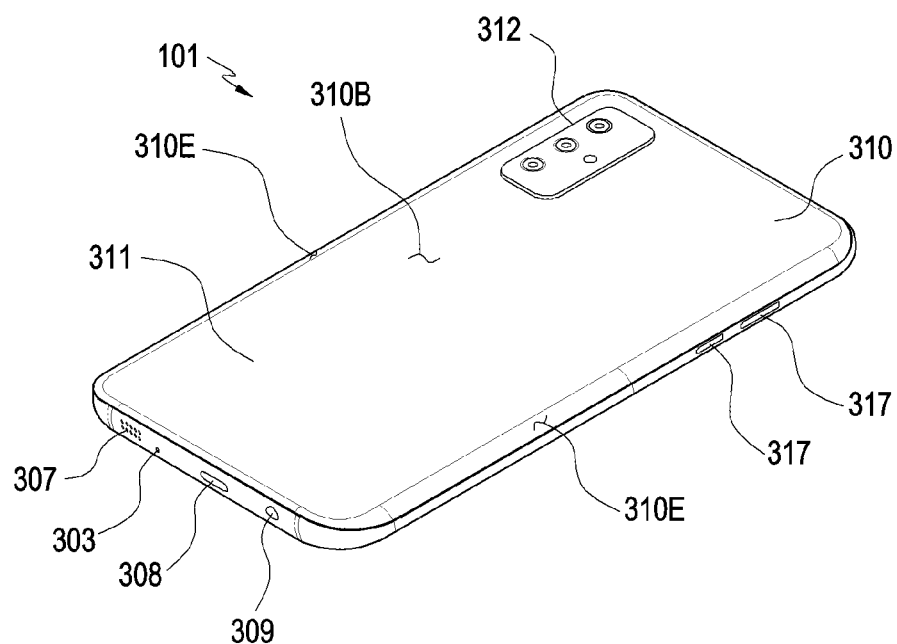
FIG. 3 is a rear perspective view of an electronic device according to various embodiments.

FIG. 2 is a front perspective view of an electronic device according to various embodiments. FIG. 3 is a rear perspective view of an electronic device according to various embodiments.

Referring to FIG. 2 and FIG. 3, an electronic device 101 according to an embodiment may include a housing 310 including a front surface 310A, a rear surface 310B, and a side surface 310C surrounding a space between the front surface 310A and the rear surface 310B. In an embodiment (not shown), the housing 310 may be referred to as a structure for forming a part of the front surface 310A of FIG. 2 and the rear surface 310B and the side surface 310C of FIG. 3. According to an embodiment, at least a part of the front surface 310A may be configured by a substantially transparent front plate 302 (e.g., a polymer plate or a glass plate containing various coating layers). The rear surface 310B may be configured by the rear plate 311. The rear plate 311 may be formed of, for example, glass, ceramic, polymer, metal (e.g., aluminum, stainless steel (STS), or magnesium), or a combination of at least two of the above materials. The side surface 310C may be coupled to the front plate 302 and the rear plate 311 and be configured by a side bezel structure (or "a side member") 318 including metal and/or polymer. In an embodiment, the rear plate 311 and the side bezel structure 318 may be integrally formed with each other and include the same material (e.g., glass, a metal material such as aluminum, or ceramic).

In the illustrated embodiment, the front plate 302 may include two first edge areas 310D, which are bent from the front surface 310A toward the rear plate 311 to extend seamlessly, at opposite ends of a long edge of the front plate 302. In the illustrated embodiment (see FIG. 3), the rear plate 311 may include two second edge areas 310E, which are bent from the rear surface 310B toward the front plate 302 to extend seamlessly, at opposite ends of a long edge of the rear plate 311. In an embodiment, the front plate 302 (or the rear plate 311) may include only one of the first edge areas 310D (or the second edge areas 310E). In an embodiment, a part of the first edge areas 310D or the second edge areas 310E may not be included. In the embodiments, when viewed from the side surface of the electronic device 101, the side bezel structure 318 may have a first thickness (or width) on a side which does not include the first edge areas 310D or the second edge areas 310E as described above and have a second thickness thinner than the first thickness on a side which include the first edge areas 310D or the second edge areas 310E.

According to an embodiment, the electronic device 101 may include at least one among a display 301, audio modules 303, 307, and 314 (e.g., the audio module 170 of FIG. 1), a sensor module (e.g., the sensor module 176 of FIG. 1), camera modules 305, 312 (e.g., the camera module 180 in FIG. 1), a key input device 317 (e.g., the input module 150 in FIG. 1), and connector holes 308 and 309 (e.g., the connection terminal 178 in FIG. 1). In an embodiment, the electronic device 101 may omit at least one (e.g., the connector hole 309) of the elements or may additionally include another element.

According to an embodiment, for example, the display 301 may be visually exposed (e.g., visible) through a considerable portion of the front plate 302. In an embodiment, at least a part of the display 301 may be visible through the front plate 302 forming the front surface 310A and the first edge areas 310D. In an embodiment, a corner of the display 301 may be configured to be substantially identical to an outer peripheral shape adjacent to the front plate 302. In an embodiment (not shown), in order to expand an visible area of the display 301, the interval between the outer periphery of the display 301 and the outer periphery of the front plate 302 may be configured to be substantially the same. It will be understood that the terms "visually exposed", "exposed" and "visible" when used with reference to the display may be used interchangeably and include a display having a cover glass, cover layer, protective film, etc.

According to an embodiment, a surface of the housing 310 (or the front plate 302) may include a screen display area configured as the display 301 is visually exposed (e.g., visible). As an example, the screen display area may include the front surface 310A and the first edge areas 310D.

In an embodiment (not shown), a recess or an opening may be formed in a part of the screen display area (e.g., the front surface 310A and the first edge areas 310D) of the display 301, and at least one among an audio module 314, a sensor module (not shown), a light emitting element (not shown), and the camera module 305 aligned with the recess or the opening may be included. In an embodiment (not shown), at least one among an audio module 314, a sensor module (not shown), a camera module 305, a fingerprint sensor (not shown), and a light emitting element (not shown) may be included on the rear surface of the screen display area of the display 301. In an embodiment (not shown), the display 301 may be disposed to be coupled or adjacent to a touch sensing circuit, a pressure sensor capable of measuring the intensity (pressure) of a touch, and/or a digitizer for detecting a magnetic stylus pen. In an embodiment, at least a part of the key input device 317 may be disposed in the first edge areas 310D and/or the second edge areas 310E.

According to an embodiment, the audio modules 303, 307, and 314 may include, for example, a microphone hole 303 and speaker holes 307 and 314. With respect to the microphone hole 303, a microphone may be disposed in the microphone hole to obtain external sound, and in an embodiment, a plurality of microphones may be arranged in the microphone hole to detect the direction of sound. The speaker holes 307 and 314 may include an external speaker hole 307 and a receiver hole 314 for a phone call. In an embodiment, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above structure, and various design changes such as mounting only a part of audio modules or adding a new audio module may be made depending on the structure of the electronic device 101.

According to an embodiment, the sensor module (not shown) may produce, for example, an electrical signal or data value corresponding to an external environmental state or an internal operating state of the electronic device 101. The sensor module (not shown) may include, for example, a first sensor module (e.g., a proximity sensor) and/or a second sensor module (e.g., a fingerprint sensor) disposed on the front surface 310A of the housing 310, and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as the front surface 310A (e.g., the display 301) of the housing 310. The electronic device 101 may further include a sensor module not shown, for example, at least one among a gesture sensor, a gyro sensor, an air pressure sensor, a magnetic sensor, an acceleration sensor, a grip sensor, a color sensor, an infrared (IR) sensor, a biometric sensor, a temperature sensor, and a humidity sensor, or an illuminance sensor. The sensor module is not limited to the above structure, and various design changes such as mounting only a part of sensor modules or adding a new sensor module may be made depending on the structure of the electronic device 101.

According to an embodiment, the camera modules 305, 312, and 313 may include, for example, a front camera module 305 disposed on the front surface 310A of the electronic device 101, a rear camera module 312 disposed on the rear surface 310B, and/or a flash 313. The camera modules 305 and 312 may include one or more lenses, image sensors, and/or image signal processors. The flash 313 may include, for example, a light emitting diode or a xenon lamp. In an embodiment, two or more lenses (an infrared camera, a wide-angle lens, and a telephoto lens) and image sensors may be arranged on one surface of the electronic device 101. The camera modules 305, 312, and 313 are not limited to the above structure, and various design changes such as mounting only a part of camera modules or adding a new camera module may be made depending on the structure of the electronic device 101.

According to an embodiment, the electronic device 101 may include a plurality of camera modules (e.g., dual cameras or triple cameras) each having a different property (e.g., angle of view) or function. For example, a plurality of camera modules 305 and 312 including lenses having different angles of view may be configured, and the electronic device 101 may control the camera modules 305 and 312 performed in the electronic device 101, to change the angles of view thereof based on a user's selection. For example, at least one of the plurality of camera modules 305 and 312 may be a wide-angle camera, and at least one other may be a telephoto camera. Similarly, at least one of the plurality of camera modules 305 and 312 may be a front camera and at least one other may be a rear camera. In addition, the plurality of camera modules 305 and 312 may include at least one among a wide-angle camera, a telephoto camera, or an infrared (IR) camera (e.g., a time of flight (TOF) camera or a structured light camera). According to an embodiment, the IR camera may operate as at least a part of a sensor module. For example, the TOF camera may operate as at least a part of the sensor module (not shown) for detecting a distance to a subject.

According to an embodiment, the key input device 317 may be disposed on the side surface 310C of the housing 310. In an embodiment, the electronic device 101 may not include a part or all of the above-mentioned key input device 317, and the key input device 317 which is not included may be implemented in another form such as a soft key on the display 301. In an embodiment, the key input device may include a sensor module 316 disposed on a second surface 310B of the housing 310.

According to an embodiment, the light emitting element (not shown) may be disposed, for example, on the front surface 310A of the housing 310. For example, the light emitting element (not shown) may provide state information of the electronic device 101 in a form of light. In an embodiment, for example, the light emitting device (not shown) may provide a light source interlocked with the operation of the front camera module 305. The light emitting device (not shown) may include, for example, an LED, an IR LED, and/or a xenon lamp.

According to an embodiment, the connector holes 308 and 309 may include, for example, a first connector hole 308 capable of accommodating a connector (e.g., a USB connector) for transmitting and receiving power and/or data to and from an external electronic device, and/or a second connector hole (e.g., an earphone jack) 309 capable of accommodating a connector for transmitting and receiving audio signals to and from an external electronic device.

According to an embodiment, a part of the camera modules 305 among the camera modules 305 and 312 and/or a part of the sensor modules (not shown) may be arranged to be exposed to the outside through at least a part of the display 301. For example, the camera module 305 may include a punch hole camera disposed in a hole or a recess formed on the rear surface of the display 301. According to an embodiment, the camera module 312 may be disposed in the housing 310 such that a lens is exposed through the second surface 310B of the electronic device 101. For example, the camera module 312 may be disposed on a printed circuit board (e.g., a printed circuit board 340 of FIG. 4).

According to an embodiment, the camera module 305 and/or the sensor module may be arranged from an internal space of the electronic device 101 to the front plate 302 of the display 301 to be in contact with the external environment through a transparent area. In addition, a part of sensor modules 304 may be arranged to perform functions without being visually exposed through the front plate 302 in the internal space of the electronic device.

Figure 4:
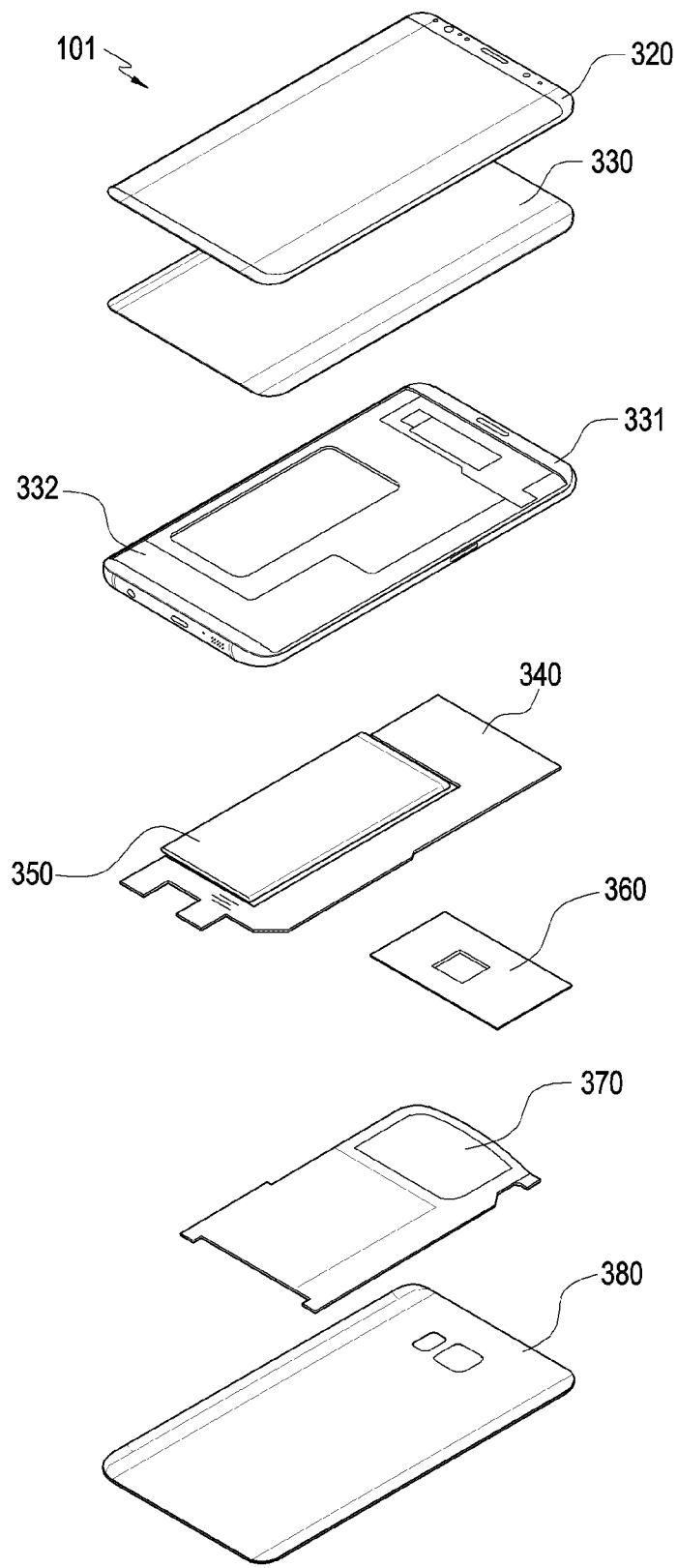
FIG. 4 is an exploded perspective view of an electronic device according to various embodiments.

FIG. 4 is an exploded perspective view of an electronic device according to various embodiments.

Referring to FIG. 4, the electronic device 101 (e.g., the electronic device 101 of FIG. 1 to FIG. 3) according to various embodiments may include a side bezel structure 331 (e.g., the side bezel structure 318 of FIG. 2), a first support member 332, a front plate 320 (e.g., the front plate 302 in FIG. 2), a display 330 (e.g., the display 301 in FIG. 2), a printed circuit board 340 (e.g., a PCB, a flexible PCB (FPCB), or a rigid flexible PCB (RFPCB)), a battery 350 (e.g., the battery 189 in FIG. 1), a second support member 360 (e.g., a rear case), an antenna 370 (e.g., an antenna module 197 in FIG. 1), and a rear plate 380 (e.g., the rear plate 311 in FIG. 2). In an embodiment, the electronic device 101 may omit at least one of the elements (e.g., the first support member 332 or the second support member 360) or may additionally include another element. At least one of the elements of the electronic device 101 may be the same as or similar to at least one of the elements of the electronic device 101 of FIG. 2 or FIG. 3, and the overlapping descriptions may be omitted below.

According to various embodiments, the first support member 332 may be disposed in the electronic device 101 to be connected to the side bezel structure 331 or may be integrally formed with the side bezel structure 331. For example, the first support member 332 may be formed of a metal material and/or a non-metal material (e.g., polymer). The display 330 may be coupled to one surface of the first support member 332, and the printed circuit board 340 may be coupled to the other surface thereof.

According to various embodiments, a processor, a memory, and/or an interface may be mounted on the printed circuit board 340. The processor may include, for example, one or more among a central processing unit, an application processor, a graphics processing unit, an image signal processor, a sensor hub processor, or a communication processor. According to various embodiments, the printed circuit board 340 may include a flexible printed circuit board type radio frequency cable (FRC). For example, the printed circuit board 340 may be disposed on at least a part of the first support member 332 and be electrically connected to an antenna module (e.g., the antenna module 197 of FIG. 1) and a communication module (e.g., the communication module 190 of FIG. 1).

According to an embodiment, the memory may include, for example, a volatile memory or a non-volatile memory.

According to an embodiment, the interface may include, for example, a high definition multimedia interface (HDMI), a universal serial bus (USB) interface, an SD card interface, and/or an audio interface. For example, the interface may electrically or physically connect the electronic device 101 to an external electronic device, and may include a USB connector, an SD card/MMC connector, or an audio connector.

According to various embodiments, the battery 350 is a device for supplying power to at least one element of the electronic device 101, and may include, for example, a non-rechargeable primary battery, a rechargeable secondary battery, or a fuel cell. At least a part of the battery 350 may be disposed, for example, substantially on the same plane as the printed circuit board 340. The battery 350 may be integrally disposed in the electronic device 101 or be detachably disposed from the electronic device 101.

According to various embodiments, a second support member 360 (e.g., a rear case) may be disposed between the printed circuit board 340 and the antenna 370. For example, the second support member 360 may include one surface to which at least one of the printed circuit board 340 or the battery 350 is coupled, and the other surface to which the antenna 370 is coupled.

According to various embodiments, the antenna 370 may be disposed between the rear plate 380 and the battery 350. For example, the antenna 370 may include a near field communication (NFC) antenna, a wireless charging antenna, and/or a magnetic secure transmission (MST) antenna. For example, the antenna 370 may perform short-range communication with an external device or wirelessly transmit or receive power required for charging. In an embodiment, an antenna structure may be configured by a part of the side bezel structure 331 and/or the first support member 332 or a combination thereof.

According to various embodiments, the rear plate 380 may form at least a part of the rear surface (e.g., the second surface 310B of FIG. 3) of the electronic device 101.

Figure 5:
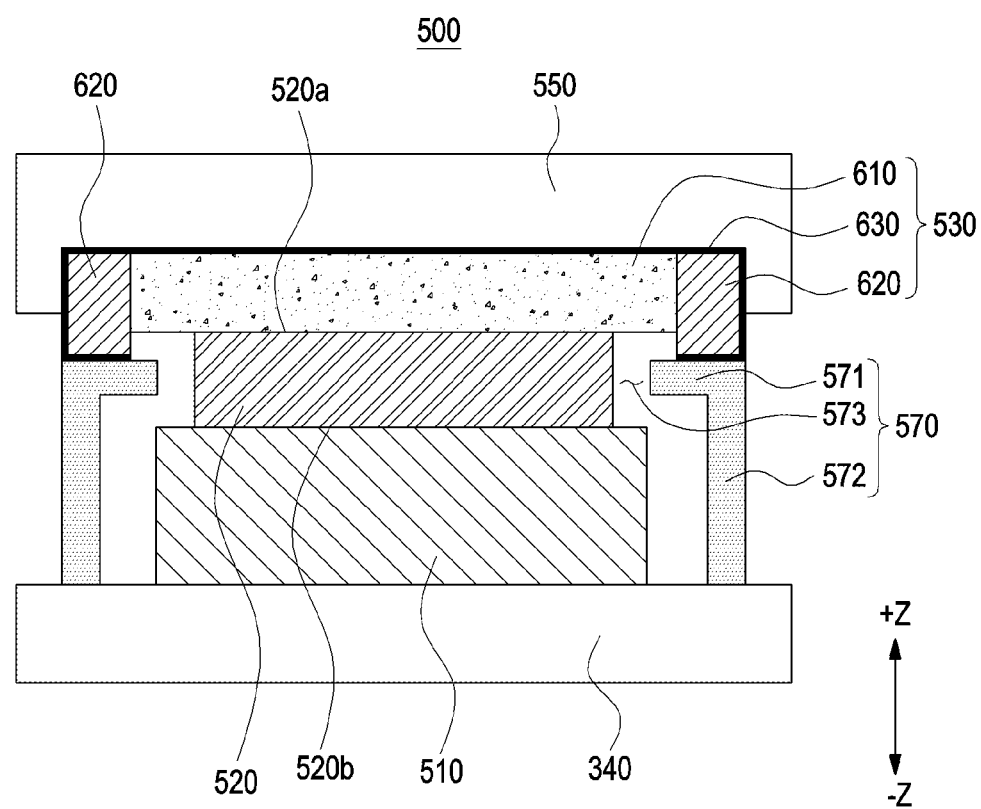
FIG. 5 is a cross-sectional view illustrating a heat diffusion structure for shielding and heat dissipation around an electronic element in an electronic device according to various embodiments.
Figure 6:
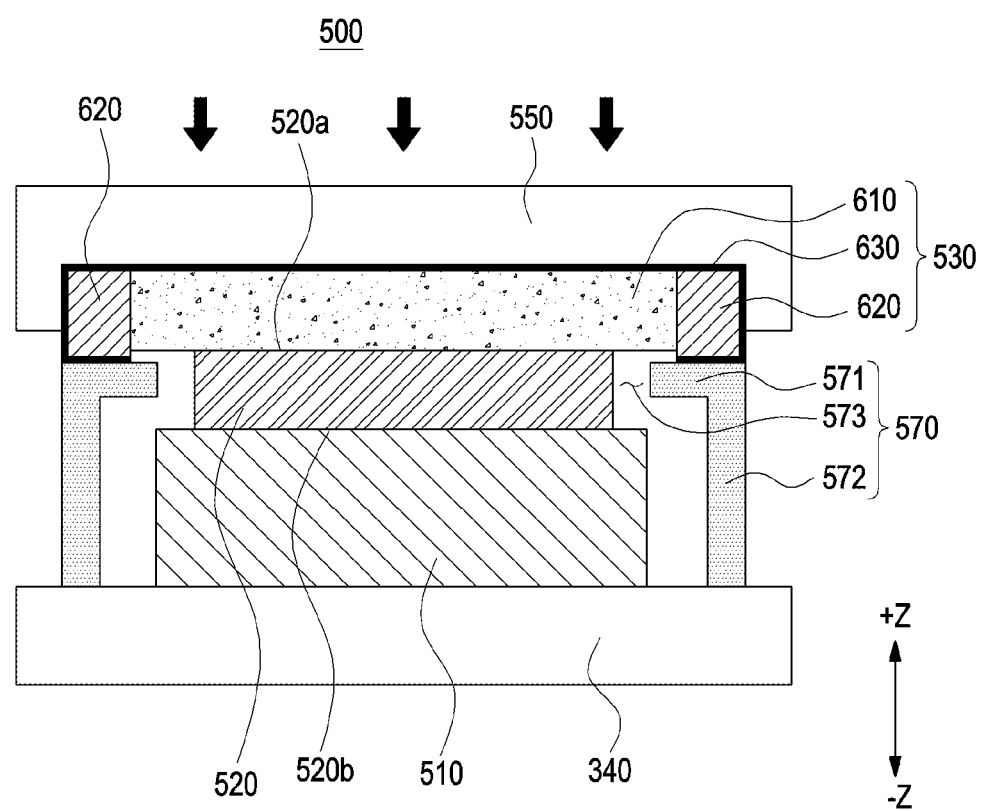
FIG. 6 is a cross-sectional view illustrating a heat diffusion structure for shielding and heat dissipation around an electronic element in an electronic device according to various embodiments.

FIG. 5 is a cross-sectional view illustrating an example heat diffusion structure for shielding and heat dissipation around an electronic element in an electronic device according to various embodiments. FIG. 6 is a cross-sectional view illustrating an example heat diffusion structure for shielding and heat dissipation around an electronic element in an electronic device according to various embodiments.

FIG. 5 is a view illustrating an example heat diffusion structure before being pressed by a bracket or during a manufacturing process, and FIG. 6 is a view illustrating an example heat diffusion structure after being pressed by a bracket or after manufacturing is completed.

According to various embodiments, an electronic device (e.g., the electronic device 101 of FIG. 1 to FIG. 4) may include a heat dissipation structure 500. The heat dissipation structure 500 may include a circuit board 340, at least one electronic element 510, at least one heat transfer member 520, a heat diffusion structure 530, and a shield can 570. According to an embodiment, the configurations of the circuit board 340 and the bracket 550 of FIG. 5 and FIG. 6 may be partially or entirely the same as those of the printed circuit board 340 and the first support member 332 of FIG. 4.

In FIG. 5 and FIG. 6, "+Z or −Z" may indicate the upper and lower directions when the heat dissipation structure 500 is viewed from the side. In addition, in an embodiment of the disclosure, "+Z" indicates the front direction in which the electronic element 510 disposed in the electronic device faces a front cover (e.g., a front plate 320 in FIG. 4), and "−Z" may indicate a rear direction in which the electronic element 510 disposed in the electronic device faces a rear cover (e.g., the rear plate 380 of FIG. 4).

According to various embodiments, a plurality of electronic elements may be arranged on at least one side surface of the circuit board 340 (e.g., the circuit board 340 of FIG. 4). Some of the plurality of electronic elements 510 are heat generating sources, may be, for example, at least one chip disposed on at least one side surface of the circuit board 340, and may include at least one among a power management integrated circuit (PMIC), a power amplifier (PAM), an application processor (AP), a communication processor (CP), a charge integrated circuit (IC), or a DC converter. In the illustrated embodiment, the electronic element 510 may be an application processor (AP) or a power management integrated circuit (PMIC).

According to various embodiments, the shield can 570 may be configured to surround at least a part of the electronic element 510. For example, the shield can 570 may be mounted on one surface of the circuit board 340 while accommodating the electronic element 510. According to an embodiment, when the heat dissipation structure 500 of the electronic device is viewed from above (e.g., when viewed in the −Z-axis direction), at least one opening (e.g., a first opening 573) may be formed in an area corresponding to the electronic element 510 to prevent and/or reduce a part of the shield can 570 from overlapping the electronic element 510. For example, a first opening 573 may be formed in an area where at least a part of the electronic element 510 is located or may provide a space in which a material which is different from the electronic element 510 is capable of coming into contact with each other, and thus heat produced by the electronic element 510 may be easily dissipated to the outside.

According to an embodiment, the shield can 570 may be coupled to one surface (e.g., one surface facing +Z-axis direction) of the circuit board 340. For example, at least a part of one surface of the circuit board 340 and the shield can 570 may be coupled to each other by a soldering method. According to an embodiment, the shield can 570 may form the first opening 573, and include an upper portion 571 in which a part of the heat diffusion structure 530 is located and a side portion 572 forming a space between the upper portion 571 and the circuit board 340. The first opening 573 may provide a movement path for heat produced by the electronic element 510, and when viewed from above, the shield can 570 may be manufactured in a shape (e.g., a closed quadrangular loop) of surrounding at least a part of the electronic element 510.

According to various embodiments, the heat transfer member 520 may be disposed between the electronic element 510 and the heat diffusion structure 530 to transfer heat produced by the electronic element 510 to the heat diffusion structure 530. At least a part of the heat transfer member 520 may be disposed to extend through the first opening 573 of the shield can 570, a first surface 520a facing the +Z-axis direction may be disposed in direct contact with at least a part of the heat diffusion structure 530, and the second surface 520b facing the −Z-axis direction may be disposed in direct contact with at least a part of the electronic element 510. According to an embodiment, the heat transfer member 520 and the heat diffusion structure 530 may be in surface contact with each other to be adhered by a conductive adhesive film.

According to an embodiment, the heat transfer member 520 may be configured of a carbon fiber thermal interface material (TIM) capable of transferring heat produced by the electronic element 510. The heat transfer member 520 is not limited to the carbon fiber TIM, and may include various heat dissipating materials or members for transferring heat produced by the electronic element 510 to the outside or to the cover of the electronic device. For example, the heat transfer member 520 may include at least one among a thermal interface material (TIM), a heat pipe, a vapor chamber, a heat dissipation sheet, or a heat dissipation paint. The material of the heat dissipation sheet or the heat dissipation paint may include, for example, a high thermal conductivity material such as black lead, carbon nanotubes, a natural renewable material, silicone, silicon, or graphite. As another example, the carbon fiber TIM may include at least any one among a liquid phase thermal interface material (TIM) and/or a solid phase thermal interface material (TIM).

According to an embodiment, the electronic device may include a plurality of heat transfer members 520. For example, if the electronic device includes a plurality of electronic elements 510, the electronic device may include heat transfer members 520 arranged in contact with the electronic elements 510, respectively.

According to various embodiments, the heat diffusion structure 530 may be disposed over at least a part of the heat transfer member 520 and the shield can 570. The heat diffusion structure 530 may provide a shielding function against electromagnetic waves which may be produced by the electronic element 510 and may provide a heat conduction function for transferring heat which may be produced by the electronic element 510 to the outside of the electronic element 510. For example, the heat diffusion structure 530 may be disposed to cover at least a part of the first opening 573 of the shield can 570 so as to shield electromagnetic waves of the electronic element 510. As another example, the heat diffusion structure 530 may be disposed on one side surface (e.g., the surface facing the +Z-axis direction of the upper portion 571) of the shield can 570 along the portion where the first opening 573 is formed and the periphery of the first opening 573.

According to an embodiment, the heat diffusion structure 530 may include a heat dissipation member 610, an elastic member 620 formed along an edge of the heat dissipation member 610, and a shielding member 630 disposed to surround at least a part of the heat dissipation member 610 and the elastic member 620. The heat dissipation member 610 of the heat diffusion structure 530 may be disposed in direct contact with the heat transfer member 520 and may diffuse heat transferred from the electronic element 510. In addition, the diffused heat may be transferred to the bracket 550 of the electronic device 101. The elastic member 620 of the heat diffusion structure 530 may be connected to the heat dissipation member 610 and disposed on a portion of the shield can 570 to provide elasticity to the heat diffusion structure 530 as a whole. By the elastic force of the elastic member 620, after the process is completed, a heat transfer path from the electronic element 510 to the bracket 550 may be reduced, and the electronic element 510 may be protected from external impact. The shielding member 630 of the heat diffusion structure 530 may seal a space through which electromagnetic waves are transmitted from the first opening 573 of the shield can 570 to the bracket 550, and thus electromagnetic waves produced by the electronic element 510 may be shielded. Hereinafter, detailed descriptions of the heat dissipation member 610, the elastic member 620, and the shielding member 630 of the heat diffusion structure 530 will be described later.

According to an embodiment, the elastic member 620 and the heat transfer member 520 of the heat diffusion structure 530 may be configured of a material including an elastic material and be connected to each other by the heat dissipation member 610 of the heat diffusion structure 530, and thus may share the movement according to the up-and-down movement. For example, the heat diffusion structure 530 may be configured, together with the heat transfer member 520, to be movable in the −Z-axis direction facing the electronic element 510 and in the +Z-axis direction opposite to the −Z-axis direction.

According to various embodiments, the bracket 550 may be disposed on the heat diffusion structure 530 and quickly dissipate heat transferred from the electronic element 510 to the outside of the electronic device, thereby lowering the temperature around the electronic element 510. For example, the bracket 550 may be disposed in direct contact with the heat diffusion structure 530, and thus the heat transfer path may be limited only to the electronic element 510, the heat transfer member 520, the heat diffusion structure 530, and the bracket 550, thereby improving the cooling performance of the heat produced by the electronic element 510.

A general heat dissipation structure may include a heat transfer member (e.g., a CF TIM) and a shielding layer (e.g., a nano TIM) on a heat transfer path. The shielding layer may have a greater thermal resistance than the heat transfer member, and thus thermal diffusion performance may be reduced. The heat dissipation structure 500 according to the disclosure may generally exclude a shielding layer (e.g., a nano Tim) disposed on a heat transfer path and may dispose the heat diffusion structure 530 including the heat dissipation member 610 having improved heat transfer performance between the bracket 550 and the heat transfer member 520 to be in contact therewith, and thus the heat produced by the electronic element 510 may be quickly dissipated to the outside of the electronic device.

Figure 7:
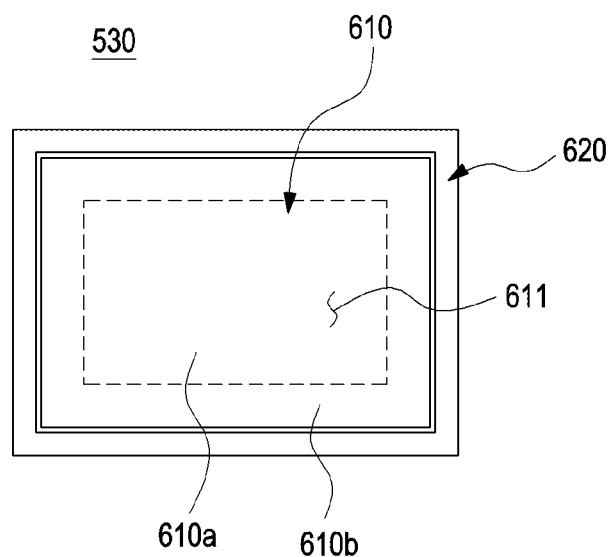
FIG. 7 is a diagram illustrating front view showing an arrangement relationship of a heat dissipation member and an elastic member of a heat diffusion structure according to various embodiments.
Figure 8:
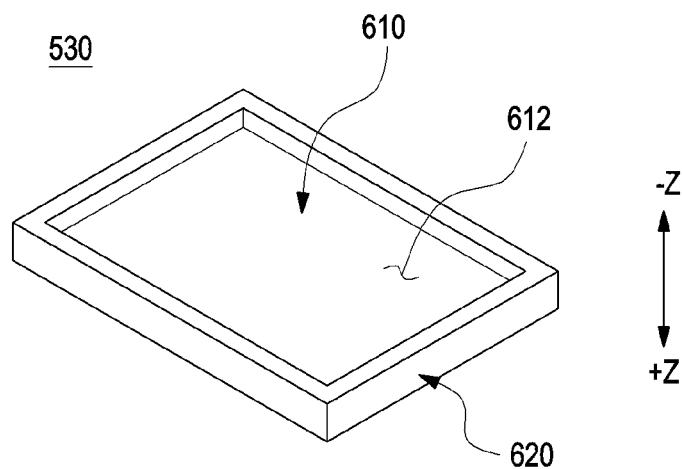
FIG. 8 is a perspective view illustrating an arrangement relationship of a heat dissipation member and an elastic member of a heat diffusion structure according to various embodiments.

FIG. 7 is a diagram illustrating a front view showing an arrangement relationship of a heat dissipation member and an elastic member of a heat diffusion structure according to various embodiments. FIG. 8 is a perspective view illustrating an arrangement relationship of a heat dissipation member and an elastic member of a heat diffusion structure according to various embodiments.

According to various embodiments, an electronic device (e.g., the electronic device 101 of FIG. 1 to FIG. 4) may include a heat dissipation structure (e.g., the heat dissipation structure 500 of FIG. 6). The heat dissipation structure 500 may include a circuit board (e.g., the circuit board 340 of FIG. 6), at least one electronic element (e.g., the electronic element 510 of FIG. 6), at least one heat transfer member (e.g., the heat transfer member 520 of FIG. 6), a heat diffusion structure (e.g., the heat diffusion structure 530 of FIG. 6), and a shield can (e.g., the shield can 570 of FIG. 6). According to an embodiment, the configuration of the heat diffusion structure 530 of FIG. 7 and FIG. 8 may be partially or entirely the same as that of the heat diffusion structure 530 of FIG. 5 and FIG. 6.

According to various embodiments, the heat diffusion structure 530 may include the heat dissipation member 610 and the elastic member 620. For example, the heat dissipation member 610 may be provided in a plate shape as a whole, and the elastic member 620 may be configured to surround an edge of the heat dissipation member 610. The heat dissipation member 610 and the elastic member 620 may be manufactured by being laminated to form a single structure.

According to an embodiment, the heat dissipation member 610 may include a first portion 610a forming a central area and capable of directly facing a heat transfer member (e.g., the heat transfer member 520 of FIG. 6) and a second portion 610b forming an edge area of the heat dissipation member 610 and capable of facing a portion of a shield can (e.g., the shield can 570 of FIG. 6). According to an embodiment, in the heat diffusion structure 530, the first portion 610a may be positioned to face the first opening (e.g., the first opening 573 of FIG. 6) and the heat transfer member 520 located within the first opening 573, and at least a part of the second portion 610b may be positioned over the shield can 570 and may extend from the elastic member 620 to support the first portion 610a.

According to an embodiment, the heat dissipation member 610 may include a high thermal conductivity material such as black lead, carbon nanotubes, a natural renewable material, silicone, silicon, or graphite. As another example, the heat dissipation member 610 may be provided in a structure in which a plurality of graphite layers are stacked. According to an embodiment, the heat dissipation member 610 may have a designated first thickness as a whole, and the designated first thickness may be approximately 0.2 mm to 0.4 mm. For example, the designated first thickness may be approximately 0.3 mm.

According to an embodiment, the elastic member 620 may be disposed along an edge of the heat dissipation member 610. For example, the elastic member 620 may be manufactured in a closed loop shape, disposed in contact with the second portion 610b of the heat dissipation member 610, and disposed to entirely surround the outer side surface of the second portion 610b. As the elastic member 620 is manufactured to correspond to the shape of the heat dissipation member 610, in a case where the heat dissipation member 610 is provided in a triangular, quadrangular, or circular plate shape, correspondingly, the elastic member 620 may be manufactured in a triangular, quadrangular, or circular closed loop shape.

According to an embodiment, the elastic member 620 may provide compressive force to the heat diffusion structure 530 and help improve shielding force. The elastic member 620 may be directly positioned on the shield can 570 and connected to the heat dissipation member 610 in an inward direction, thereby supporting the heat dissipation member 610 and simultaneously transmitting elastic force. For example, the elastic member 620 may form a polyurethane (PU) foam including polyurethane, and the polyurethane foam may provide compressive force which decreases by approximately 20% to 40% in thickness depending on an external force. As another example, the elastic member 620 may improve the shielding force of the heat diffusion structure 530 by directly transferring the compressive force to a shielding member (e.g., the shielding member 630 of FIG. 5) disposed in contact with the shield can 570.

According to an embodiment, the elastic member 620 forms a designated second thickness as a whole, and the designated second thickness may be greater than the designated first thickness of the heat dissipation member 610. The designated second thickness may be approximately 0.5 mm to 0.9 mm. The designated second thickness may be approximately 0.7 mm. According to an embodiment, the elastic member 620 forming a designated second thickness may decrease in thickness when pressure is applied from the outside by compressive force. For example, in a case where the designated second thickness is approximately 0.5 mm to 0.9 mm, when external pressure is applied, a thickness of approximately 0.15 mm to 0.25 mm may be reduced via compression. As another example, in a case where the designated second thickness is approximately 0.7 mm, when pressure is applied from the outside, a thickness of approximately 0.2 mm may be reduced via compression.

According to an embodiment, in order to enable the elastic member 620 to be laminated along an edge of the structure of the heat dissipation member 610 in which a plurality of graphite layers are stacked, a conductive adhesive sheet may be disposed between the elastic member 620 and the heat dissipation member 610. The conductive adhesive sheet may transmit up and down movements corresponding to the compressive force of the elastic member 620 to the heat dissipation member 610. According to an embodiment, in a case where the elastic member 620 is pressurized by a bracket in a process, the heat dissipation member 610 may compress the heat transfer member 520 by the pressurization and maintain a close contact state without an air gap. Accordingly, heat produced by the electronic element 510 may be quickly and stably transferred toward another material (e.g., the bracket 550).

According to an embodiment, in a case where an external impact is applied to the heat diffusion structure 530 or the elastic member 620 is pressurized by a bracket in a process, the heat dissipation member 610 extending (e.g., laminated) from the elastic member 620 may provide motion in the −Z-axis direction facing the electronic element 510. The heat transfer member 520 disposed in contact with the heat dissipation member 610 may be compressed in the −Z-axis direction in response to the movement of the heat dissipation member 610 to disperse an externally applied force. Accordingly, an impact directly applied to the electronic element 510 may be prevented and/or reduced.

Figure 9:
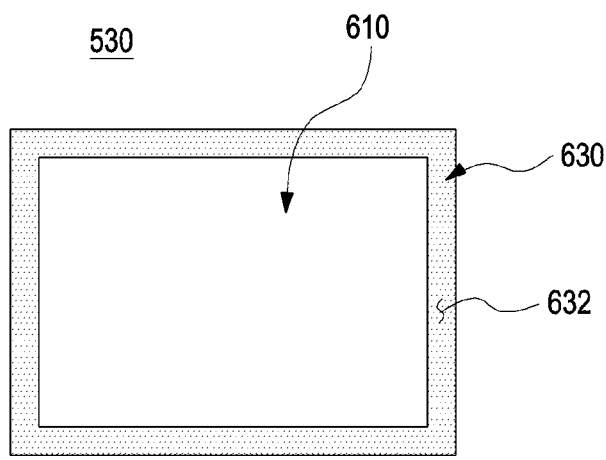
FIG. 9 is a diagram illustrating a front view showing an arrangement relationship of a heat dissipation member, an elastic member, and a shielding member of a heat diffusion structure according to various embodiments.
Figure 10:
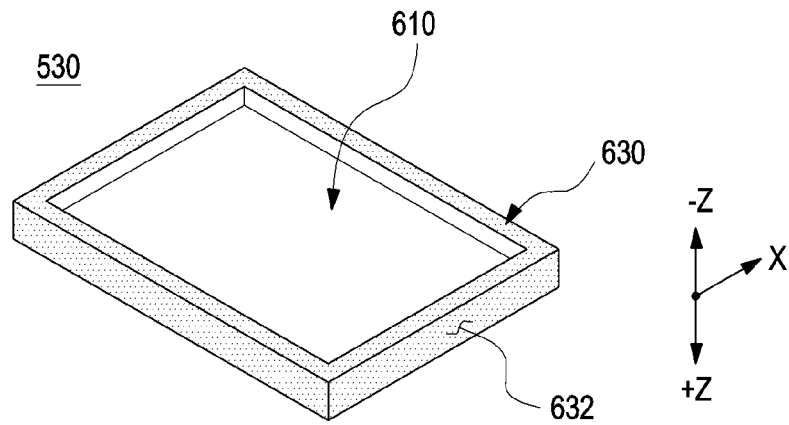
FIG. 10 is a perspective view illustrating an arrangement relationship of a heat dissipation member, an elastic member, and a shielding member of a heat diffusion structure, when viewed from one direction, according to various embodiments.
Figure 11:
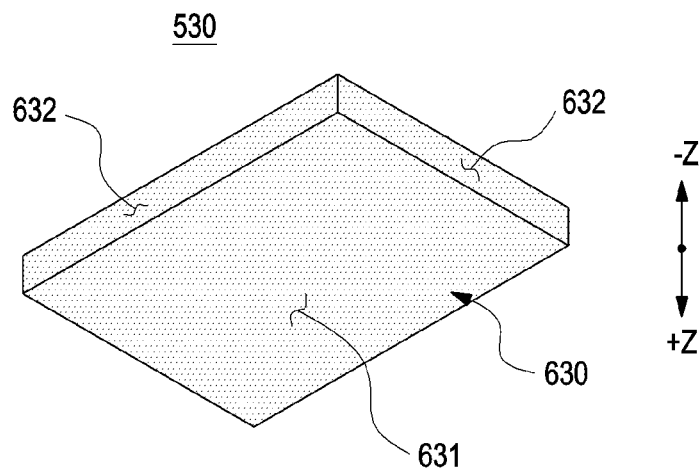
FIG. 11 is a perspective view illustrating an arrangement relationship of a heat dissipation member, an elastic member, and a shielding member of a heat diffusion structure, when viewed from another direction, according to various embodiments.

FIG. 9 is a diagram illustrating a front view showing an arrangement relationship of a heat dissipation member, an elastic member, and a shielding member of a heat diffusion structure according to various embodiments. FIG. 10 is a perspective view illustrating an arrangement relationship of a heat dissipation member, an elastic member, and a shielding member of a heat diffusion structure, when viewed from one direction, according to various embodiments. FIG. 11 is a perspective view illustrating an arrangement relationship of a heat dissipation member, an elastic member, and a shielding member of a heat diffusion structure, when viewed from another direction, according to various embodiments.

According to various embodiments, an electronic device (e.g., the electronic device of FIG. 1 to FIG. 4) may include a heat dissipation structure (e.g., the heat dissipation structure 500 of FIG. 6). The heat dissipation structure 500 may include a circuit board (e.g., the circuit board 340 of FIG. 6), at least one electronic element (e.g., the electronic element 510 of FIG. 6), and at least one heat transfer member (e.g., the heat transfer member 520 of FIG. 6), a heat diffusion structure (e.g., the heat diffusion structure 530 of FIG. 6), and a shield can (e.g., the shield can 570 of FIG. 6). According to an embodiment, the configuration of the heat diffusion structure 530 of FIG. 9 to FIG. 11 may be partially or entirely the same as that of the heat diffusion structure 530 of FIG. 5 to FIG. 8.

According to various embodiments, the heat diffusion structure 530 may include the heat dissipation member 610, an elastic member (e.g., the elastic member 620 of FIG. 7 and FIG. 8), and the shielding member 630. For example, the heat dissipation member 610 may be provided in a plate shape as a whole, and the elastic member 620 may be configured to surround an edge of the heat dissipation member 610. The heat dissipation member 610 and the elastic member 620 may be manufactured by being laminated to form a single structure. The shielding member 630 may be configured to surround at least a part of the heat dissipation member 610 or at least a part of the elastic member 620.

The configurations of the heat dissipation member 610 and the elastic member 620 of FIG. 9 to FIG. 11 may be partially or entirely the same as those of the heat dissipation member 610 and the elastic member 620 of FIG. 7 and FIG. 8. Hereinafter, the shielding member 630 will be described focusing on differences.

According to various embodiments, the shielding member (e.g., shield) 630 may be disposed to surround (e.g., wrap) a part or all of a structure in which the heat dissipation member 610 and the elastic member 620 are laminated (hereinafter, a laminated structure). The shielding member 630 may include a first sheet portion 631 configured to surround at least a part of the heat dissipation member 610 and a second sheet portion 632 extending from the first sheet portion 631 and configured to surround at least a part of the elastic member 620.

According to an embodiment, when viewed from the outside of the heat diffusion structure 530, the heat dissipation member 610 and the elastic member 620 may be arranged to be prevented/reduced from being exposed to the outside by the first sheet portion 631 and the second sheet portion 632 of the shielding member 630.

According to an embodiment, the first sheet portion 631 may be disposed to entirely surround the front surface (e.g., the surface facing the +Z-axis direction) of the heat dissipation member 610. A rear surface of the heat dissipation member 610 (e.g., a surface facing the −Z-axis direction) may be disposed to be in direct contact with the heat transfer member 520. Accordingly, heat produced by the electronic element 510 may be diffused to the bracket 550 disposed in contact with the shielding member 630 via the heat transfer member 520 and the heat dissipation member 610. In addition, electromagnetic waves produced by the electronic element 510 may be shielded by the first sheet portion 631 for covering an upper portion of the electronic element 510. In the illustrated embodiment, the first sheet portion 631 is configured to surround only the front surface of the heat dissipation member 610, but is not limited thereto. The first sheet portion 631 may be disposed to surround the front surface (e.g., a surface facing the +Z-axis direction) and the rear surface (e.g., a surface facing the −Z-axis direction) of the heat dissipation member 610, and thus may provide a heat transfer passage and electromagnetic wave shielding function.

According to an embodiment, the second sheet portion 632 may be disposed to entirely surround an outer surface of the elastic member 620. A portion of the second sheet portion 632 facing the +Z-axis direction may extend from the first sheet portion 631 to be disposed in direct contact with the bracket 550, and a portion thereof facing the X-axis direction may be disposed to entirely cover an outer surface of the elastic member 620 having a closed loop shape. A portion of the second sheet portion 632 facing the −Z-axis direction may be disposed between the elastic member 620 and the shield can 570 to be disposed in direct contact with the shield can 570. According to an embodiment, the second sheet portion 632 may cover even one surface of the elastic member 620 facing the inside.

According to an embodiment, the shielding member 630 may be provided with various materials including shielding performance and heat diffusion performance. For example, the shielding member 630 may include copper (Cu) and may have a designated third thickness to cover outer surfaces of the heat dissipation member 610 and the elastic member 620. The designated third thickness may be smaller than the designated first thickness and the designated second thickness. For example, the designated third thickness may be approximately 10 um to 20 um. As another example, the designated third thickness may be approximately 14 um.

Figure 12:
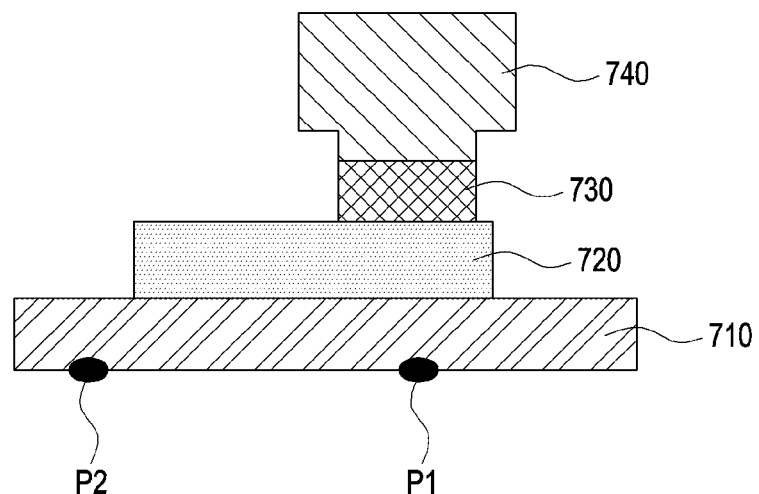
FIG. 12 is a cross-sectional view illustrating an example for testing heat dissipation performance of a heat diffusion structure according to various embodiments.

FIG. 12 is a cross-sectional view illustrating an example arrangement for testing heat dissipation performance of a heat diffusion structure according to various embodiments.

Referring to FIG. 12, an experimental example including a metal plate 710, a heat diffusion structure 720, a heat transfer member 730, and a heat producing source 740 is disclosed. The configuration of the metal plate 710, the heat diffusion structure 720, the heat transfer member 730, and the heat producing source 740 of FIG. 12 may be a configuration corresponding to the bracket 550, the heat diffusion structure 530, the heat transfer member 520, and the electronic element 510 of FIG. 5 to FIG. 10.

According to various embodiments, a method of diffusing heat produced by the heat producing source 740 is disclosed, and a temperature measurement method may be performed by dividing the method into two steps. For example, in a case where the heat producing source 740 is maintained at approximately 70 degrees, a first experimental example in which the temperature of an area (e.g., P1 position) of the metal plate 700 disposed adjacent to an area where the heat producing source 740 is disposed is measured may be performed, and in a case where the heat producing source 740 is maintained at approximately 70 degrees, a second experimental example in which the temperature of another area (e.g., P2 position) of the metal plate 700 disposed farther than the P1 position from an area where the heat producing source 740 is disposed is measured may be performed. In the first experimental example, the P1 position may be located in a direction perpendicular to the heat producing source 740, and the heat transfer member 520 and the heat diffusion structure 530 may be arranged between the heat producing source 740 and the P1 position of the metal plate 710. The heat producing source 740 has a structure corresponding to the electronic element (e.g., AP) of FIG. 5 and FIG. 6 and has a size of approximately 10*10 mm, and the temperature measurement with respect to the heat producing source 740 has been performed for approximately 15 min.

The following [Table 1] is a table measuring the maximum (Max.) temperature for each step according to the experimental example.

TABLE 1

| Note | heat transfer member (TIM) | sample | P1 | P2 | delta |
|---|---|---|---|---|---|
| existing structure | 0.38T CF TIM | nano TIM (0.17T) | 40.2° C. | 39.9° C. | 0.9° C. |
| structure of the disclosure | 0.6T CF TIM | heat diffusion structure | 45.9° C. | 44.2° C. | 1.7° C. |

Referring to FIG. 11 and [Table 1], the maximum (Max.) temperature and the gap between positions (e.g., P1 and P2) of one area of the metal plate 710 according to the first experimental example and the second experimental example may be identified. The related values (e.g., thickness) disclosed in [Table 1] correspond to an example for the experiment, and are not limited to each element of the electronic device.

Referring to the first experimental example, it may be identified that the temperature of P1 of the metal plate 710 in a direction perpendicular to the heat producing source 740 represents a maximum temperature of approximately 45.9° C. In the structure of the first experimental example, compared to the existing structure in which the nano TIM is applied instead of the heat diffusion structure 720, it may be identified that the diffusion performance is improved as the temperature of P1 increases by approximately 5.7° C.

Referring to the second experimental example, it may be identified that the maximum temperature of P2 of the metal plate 710 that is not perpendicular to the heat producing source 740 and is spaced apart from P1 by a predetermined distance is approximately 44.2° C. In the structure of the second experimental example, it may be identified that the diffusion performance of the heat diffusion structure 720 is improved according to a temperature increase of about 4.3° C. compared to the existing structure to which the nano TIM is applied instead of the heat diffusion structure 720.

Referring to the first experimental example and the second experimental example, it may be identified that the delta value representing the gap between the temperature of the P1 position and the temperature of the P2 position in the structure of the disclosure is relatively increased compared to the existing structure. Accordingly, it may be identified that the diffusion performance on the metal plate 710 is improved due to the heat diffusion structure 530.

An electronic device (e.g., the electronic device 101 of FIG. 1 to FIG. 4) according to various example embodiments may include: a circuit board (e.g., the circuit board 340 in FIG. 6), at least one electronic element disposed on one surface of the circuit board (e.g., the electronic element 510 in FIG. 6), a shield can (e.g., the shield can 570 in FIG. 6) mounted on one surface of the circuit board and covering at least a portion the electronic element and including at least one opening (e.g., the first opening 573 in FIG. 6) formed in an area corresponding to the electronic element, a heat diffusion structure comprising a heat diffusing material (e.g., the heat diffusion structure 530 of FIG. 6) disposed on at least a part of the shield can to close at least a part of the at least one opening, and a heat transfer member comprising a thermally conductive material (e.g., the heat transfer member 520 of FIG. 6) disposed between and in contact with the electronic element and the heat diffusion structure and having at least a part located in the at least one opening.

According to various example embodiments, the electronic device may further include a bracket (e.g., the bracket 550 of FIG. 6) supporting the electronic device and of which at least a part is disposed in contact with the heat diffusion structure, and configured to receive heat transferred to the electronic element via the heat transfer member and the heat diffusion structure.

According to various example embodiments, at least one among the heat diffusion structure and the heat transfer member may comprise an elastic material.

According to various example embodiments, the heat diffusion structure may include a plate-shaped heat dissipation member (e.g., the heat dissipation member 610 of FIG. 6) and an elastic member comprising an elastic material (e.g., the elastic member 620 of FIG. 6) disposed along an edge of the heat dissipation member.

According to various example embodiments, the heat dissipation member may include a first portion (e.g., the first portion 611 of FIG. 7) forming a central area and having at least a part being in direct contact with the heat transfer member, and a second portion (e.g., the second portion 612 of FIG. 8) forming an edge area of the heat dissipation member and disposed over a portion of the shield can.

According to various example embodiments, the elastic member may be configured to surround at least a part of the second portion of the heat dissipation member, and at least a part of the heat dissipation member may be disposed in direct contact with an upper surface of the shield can.

According to various example embodiments, the elastic member may be have a closed loop shape and be connected to the heat dissipation member in an inward direction, and may be configured to enable the heat dissipation member to move in a first direction facing the electronic element and in a second direction opposite to the first direction.

According to various example embodiments, the heat dissipation member may be configured to have a structure including a plurality of stacked graphite sheets, and the elastic member may include polyurethane (PU).

According to various example embodiments, the heat dissipation member and the elastic member may comprise a laminated structure using a conductive adhesive sheet.

According to various example embodiments, the heat dissipation member may have a designated first thickness, the elastic member may have a designated second thickness, and the designated second thickness may be greater than the designated first thickness.

According to various example embodiments, the elastic member may have a compressibility capable of reducing a thickness of about 20% to 40% based on a force applied from the outside.

According to various example embodiments, the heat diffusion structure may further include a shield including a first sheet portion (e.g., the first sheet portion 631 of FIG. 11) configured to surround at least a part of the heat dissipation member, and a second sheet portion (e.g., the second sheet portion 632 of FIG. 11) extending from the first sheet portion and configured to surround at least a part of the elastic member.

According to various example embodiments, the first sheet portion of the shield may be configured to surround a front surface of the heat dissipation member facing the first direction, and the second sheet portion of the shield may be configured to surround an outer surface of the elastic member. When viewed from the outside of the heat diffusion structure, the heat dissipation member and the elastic member may be blocked from being exposed to the outside.

According to various example embodiments, the electronic device may further include a bracket supporting the electronic device at least a part of the bracket being disposed in contact with the heat diffusion structure, and the shield may be disposed between the bracket and the heat dissipation member.

According to various example embodiments, the first sheet portion of the shield may be disposed in contact with the bracket, and the second sheet portion of the shield may be disposed in contact with at least a part of the shield can, configured to reduce electromagnetic waves produced by the electronic element from being transmitted to the outside.

According to various example embodiments, the heat dissipation member may have a designated first thickness, the elastic member may have a designated second thickness, the shielding member may have a designated third thickness, and the designated third thickness may be less than the designated first thickness and the designated second thickness.

An electronic device (e.g., the electronic device 101 of FIG. 1 to FIG. 4) according to various example embodiments of the disclosure may include a housing (e.g., the housing 310 of FIG. 2 and FIG. 3), a circuit board (e.g., the circuit board 340 of FIG. 6) disposed in the housing, at least on electronic element (e.g., the electronic element 510 of FIG. 6) disposed on one surface of the circuit board, a shield can (e.g., the shield can 570 of FIG. 6) surrounding at least a part of the electronic element and having at least one opening formed at a portion facing the electronic element, a heat dissipation member comprising a heat dissipating material (e.g., the heat dissipation member 610 of FIG. 6) disposed on at least a part of the shield can to close at least a part of the at least one opening, a shield (e.g., the shielding member 630 of FIG. 6) surrounding at least one surface of the heat dissipation member and including a thin film, and a heat transfer member comprising a thermally conductive material (e.g., the heat transfer member 520 of FIG. 6) disposed between and in contact with the electronic element and the heat dissipation member and having at least a part located in the at least one opening.

According to various example embodiments, the electronic device may further include an elastic member comprising an elastic material (e.g., the elastic member 620 of FIG. 6) disposed along an edge of the heat dissipation member, and the heat dissipation member, the shield, and the elastic member may be configured as an integral structure.

According to various example embodiments, the heat dissipation member may include a first portion having at least a part directly facing the heat transfer member, and a second portion including an edge area of the heat dissipation member and disposed over a portion of the shield can. The elastic member may be provided in a closed loop shape and be connected to the heat dissipation member in an inward direction, and may be configured to enable the heat dissipation member to move in a first direction facing the electronic element and in a second direction opposite to the first direction.

According to various example embodiments, the first sheet portion of the shield may be surround a front surface of the heat dissipation member, and the second sheet portion of the shield may surround an outer surface of the elastic member, thereby blocking the heat dissipation member and the elastic member from being exposed to the outside.

The heat dissipation structure of various embodiments of the disclosure described above and an electronic device including the same are not limited to the above-described embodiments and drawings, and it would be apparent to a person skilled in the art to which the disclosure belongs that various substitutions, modifications, and changes are possible within the scope of the disclosure, including the appended claims and their equivalents. It will also be understood that any of the embodiment(s) described herein may be used in conjunction with any other embodiment(s) described herein.

What is claimed is:
1. An electronic device comprising:
 a bracket;
 a circuit board disposed below the bracket;
 at least one electronic element disposed on one surface of the circuit board facing the bracket;
 a shield can mounted on the one surface of the circuit board and covering at least part of the electronic element and comprising at least one opening formed in an area corresponding to the electronic element;

a heat diffusion structure disposed between the bracket and the shield can, configured to close the at least one opening and in contact with the bracket; and a heat transfer member disposed between and in contact with the electronic element and the heat diffusion structure and at least partially located in the at least one opening, wherein the heat diffusion structure comprises:
a heat dissipation member in contact with the heat transfer member; and
a shield including a first sheet portion disposed between the bracket and the heat dissipation member, and a second sheet portion extending from the first sheet portion and surrounding at least a part of the heat dissipation member, the shield forming a structure that surrounds the electronic element together with the shield can.

2. The electronic device of claim 1,
wherein heat generated from the electronic element is transferred to the bracket through the heat transfer member and the heat dissipation member of the heat diffusion structure.

3. The electronic device of claim 1, wherein at least one of the heat diffusion structure and the heat transfer member comprises an elastic material.

4. The electronic device of claim 1,
wherein the heat dissipation member of the heat diffusion structure has:
a plate shape; and
wherein the heat diffusion structure includes an elastic member disposed along an edge of the heat dissipation member.

5. The electronic device of claim 4, wherein the heat dissipation member comprises a first portion forming a central area of the heat dissipation member and at least partially being in direct contact with the heat transfer member, and a second portion forming an edge area of the heat dissipation member and disposed over a portion of the shield can.

6. The electronic device of claim 5, wherein the elastic member is configured to surround at least a part of the second portion of the heat dissipation member, and
at least a part of the heat dissipation member is disposed in direct contact with an upper surface of the shield can.

7. The electronic device of claim 5, wherein the elastic member has a closed loop shape and is connected to the heat dissipation member in an inward direction, and configured to enable the heat dissipation member to move in a first direction facing the electronic element and in a second direction opposite to the first direction.

8. The electronic device of claim 4, wherein the heat dissipation member includes a plurality of stacked graphite sheets, and
the elastic member comprises polyurethane (PU).

9. The electronic device of claim 4, wherein the heat dissipation member and the elastic member form a laminated structure by a conductive adhesive sheet.

10. The electronic device of claim 4, wherein the heat dissipation member has a designated first thickness,
the elastic member has a designated second thickness, and
the designated second thickness is greater than the designated first thickness.

11. The electronic device of claim 4, wherein the elastic member has a compressibility capable of reducing a thickness of about 20% to 40% based on a force applied from the outside.

12. The electronic device of claim 4, wherein:
the first sheet portion is configured to surround at least a part of the heat dissipation member; and
the second sheet portion extending from the first sheet portion is configured to surround at least a part of the elastic member.

13. The electronic device of claim 12, wherein the first sheet portion of the shield surrounds at least a portion of an upper surface of the heat dissipation member,
the second sheet portion of the shield surrounds at least a portion of an outer side surface of the elastic member, and
when viewed from outside of the heat diffusion structure, the shield blocks the heat dissipation member and the elastic member are blocked from being exposed to the outside.

14. The electronic device of claim 1, wherein the first sheet portion of the shield is disposed in contact with the bracket, and
the second sheet portion of the shield is disposed in contact with at least a part of the shield can, and configured to reduce electromagnetic waves produced by the electronic element from being transmitted to the outside.

15. The electronic device of claim 4, wherein the heat dissipation member has a designated first thickness, the elastic member has a designated second thickness, and the shield has a designated third thickness,
wherein the designated third thickness is less than the designated first thickness and the designated second thickness.

16. The electronic device of claim 4,
wherein the heat dissipation member, the shield, and the elastic member are configured as an integral structure.

17. The electronic device of claim 16, wherein at least a part of the first portion directly faces the heat transfer member, and the second portion forms an edge area of the heat dissipation member and is disposed over a portion of the shield can, and
wherein the elastic member is provided in a closed loop shape and is connected to the heat dissipation member in an inward direction, and is configured to enable the heat dissipation member to move in a first direction facing the electronic element and in a second direction opposite to the first direction.

* * * * *